US008422329B2

United States Patent
Riho

(10) Patent No.: US 8,422,329 B2
(45) Date of Patent: Apr. 16, 2013

(54) SEMICONDUCTOR DEVICE WITH ANTI-FUSE ELEMENTS

(75) Inventor: Yoshiro Riho, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 164 days.

(21) Appl. No.: 13/086,777

(22) Filed: Apr. 14, 2011

(65) Prior Publication Data

US 2011/0261630 A1    Oct. 27, 2011

(30) Foreign Application Priority Data

Apr. 26, 2010  (JP) ................. 2010-101085

(51) Int. Cl.
G11C 17/18  (2006.01)

(52) U.S. Cl.
USPC .. 365/227; 365/200; 365/189.07; 365/189.09

(58) Field of Classification Search ............ 365/225.7, 365/200, 189.07, 189.09
See application file for complete search history.

(56) References Cited

U.S. PATENT DOCUMENTS

| | | | |
|---|---|---|---|
| 6,333,878 B2 * | 12/2001 | Ooishi | 365/200 |
| 6,954,103 B2 * | 10/2005 | Yamauchi et al. | 327/540 |
| 2003/0107931 A1 * | 6/2003 | Dono | 365/201 |
| 2006/0193163 A1 * | 8/2006 | Ito | 365/149 |
| 2009/0010080 A1 * | 1/2009 | Fujioka et al. | 365/189.09 |

FOREIGN PATENT DOCUMENTS

| | | |
|---|---|---|
| JP | 2000-132992 A | 5/2000 |
| JP | 2008-269711 A | 11/2008 |

* cited by examiner

Primary Examiner — Tuan T. Nguyen
(74) Attorney, Agent, or Firm — Sughrue Mion, PLLC

(57) ABSTRACT

A semiconductor device compares potential AF_G at an end of an anti-fuse element with potential VPPR. If potential AF_G is equal to or higher than potential VPPR, then the semiconductor device boosts potential VPPSVT of a power supply line that is connected to the end of the anti-fuse element. If the of the anti-fuse element and the other end thereof are connected to each other by the boosted potential, thereby making potential AF_G lower than potential VPPR, then the semiconductor device stops boosting potential VPPSVT.

14 Claims, 14 Drawing Sheets

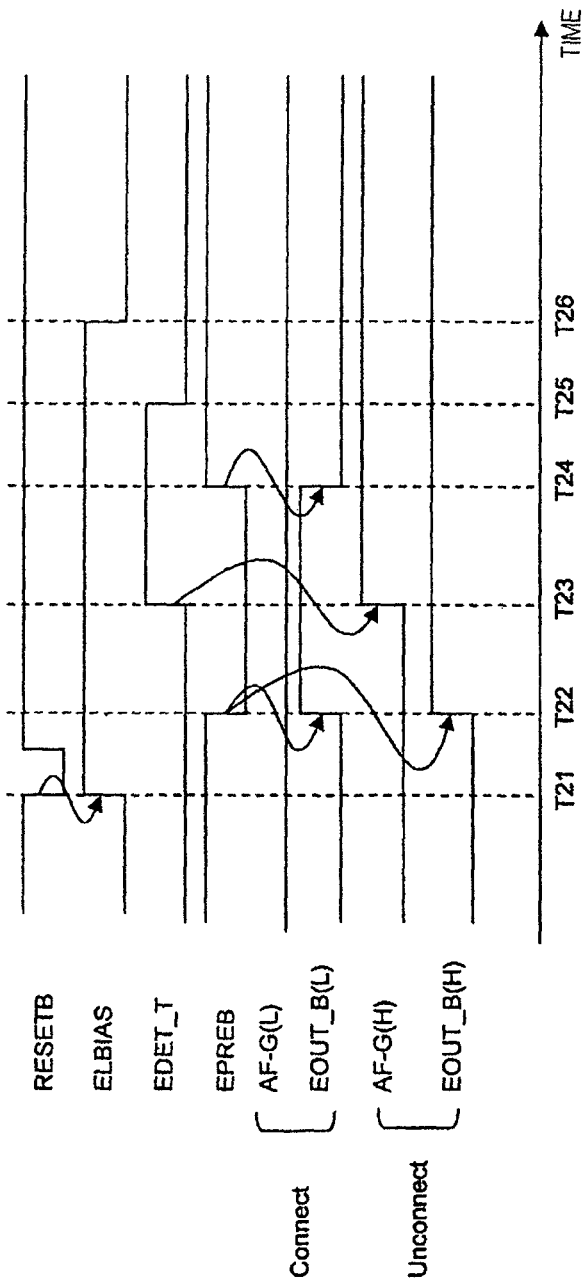

ial of the first power supply line from a first prescribed
SEMICONDUCTOR DEVICE WITH ANTI-FUSE ELEMENTS This application is based upon and claims the benefit of priority from Japanese patent application No. 2010-101085, filed on Apr. 26, 2010, the disclosure of which is incorporated herein in its entirety by reference.

BACKGROUND OF THE INVENTION

1. Field of the Invention

The present invention relates to a semiconductor device with anti-fuse elements.

2. Description of the Related Art

When a faulty memory cell which fails to operate normally is found in a semiconductor device such as a DRAM (Dynamic Random Access Memory) or the like, the faulty memory cell is replaced with a backup memory cell, and the address of the faulty memory cell is stored. If there is a request to access the stored address of the faulty memory cell, then the backup memory cell that has replaced the faulty memory cell is accessed.

The address of the faulty memory cell is stored by anti-fuse elements.

An anti-fuse element has an insulating film. When a high voltage is applied to the insulating film, the insulating film causes a dielectric breakdown to change the anti-fuse element from an insulated state to a conductive (connected) state, thereby writing data therein. One example of an anti-fuse element is a MOSFET (Metal-Oxide-Semiconductor Field-Effect Transistor), which writes data when its gate insulating film breaks down.

Patent document 1 (JP No. 2000-132992A) discloses a semiconductor device having a plurality of anti-fuse elements disposed parallel to each other in combination with corresponding selective MOSFETs.

Patent document 2 (JP No. 2008-269711A) discloses a semiconductor device which operates in synchronism with a clock signal to write data into anti-fuse element when the clock signal is a high level signal and verify whether the anti-fuse element is rendered conductive or not when the clock signal is a low level signal.

The semiconductor devices disclosed in Patent documents 1, 2 break down the insulating film, i.e., write data into the anti-fuse elements, by applying a voltage of constant level to the anti-fuse elements. The inventor of the present invention has found that the disclosed semiconductor devices have problems that will be described below.

The voltage at which the insulating film of an individual anti-fuse element breaks down tends to vary due to fabrication process variations. Therefore, a plurality of anti-fuse elements are liable to have various voltages for breaking down the insulating films thereof, i.e., various write voltages.

It is assumed that a voltage of constant level is applied to a plurality of anti-fuse elements having different write voltages to write data into the anti-fuse elements. If the write voltages vary in an increasing direction, then data may not be correctly written into the anti-fuse elements because the applied voltage is not sufficient. On the other hand, if the write voltages vary in a decreasing direction, anti-fuse elements adjacent to the anti-fuse elements into which data are to be written may be erroneously connected because the applied voltage is excessively high.

FIG. 1 of the accompanying drawings is a diagram illustrative of the problems posed when the applied voltage is excessively high.

Potential AF_G1=VPPSVT is applied via a power line to the gate of an anti-fuse element (MOSFET) into which data are to be written, and potential VBBSVT is applied via a power line to the source, drain, and N++ region of the anti-fuse element (MOSFET).

Potential AF_G2=VSS (ground potential) is applied via a power line to the gate of an adjacent anti-fuse element, and potential VBBSVT is applied via the power line to the source, drain, and N++ region of the adjacent anti-fuse element.

If an excessively high voltage is applied to the anti-fuse element into which data are to be written, a short circuit will occur between the power line connected to the gate of the anti-fuse element into which data are to be written and the power lines connected to the gate and N++ region of the adjacent anti-fuse element, through the substrate, tending to cause the adjacent anti-fuse element to be connected erroneously.

SUMMARY OF THE INVENTION

The present invention seeks to solve one or more of the above problems, or to improve upon those problems at least in part.

In one embodiment, there is provided a semiconductor device that includes a first power supply line and a second power supply line, a breakable element having an end connected to the first power supply line and another end connected to the second power supply line, and a power supply circuit connected to the end of the breakable element through the first power supply line, comparing a potential at the end of the breakable element with a first potential, boosting a potential of the first power supply line from a first prescribed potential if the potential at the end of the breakable element is equal to or higher than the first potential, and stopping boosting the potential of the first power supply line if the end of the breakable element and the other end thereof are connected to each other by the boosted potential, thereby making the potential at the end of the breakable element lower than the first potential.

According to the present invention, the semiconductor device compares the potential at the end of the breakable element with the first potential. If the potential at the end of the breakable element is equal to or higher than the first potential, then the semiconductor device boosts the potential of the first power supply line. If the end of the breakable element and the other end thereof are connected to each other by the boosted potential, thereby making the potential at the end of the breakable element lower than the first potential, then the semiconductor device stops boosting the potential of the first power supply line.

As described above, the potential of the first power supply line is boosted until the breakable element is rendered conductive. The potential of the first power supply line stops being boosted when the breakable element is rendered conductive. Therefore, the breakable element is prevented from being erroneously connected because the applied voltage is excessively high, and breakable elements which are unable to write data accurately because the applied voltage is not sufficient are prevented from occurring.

BRIEF DESCRIPTION OF THE DRAWINGS

The above features and advantages of the present invention will be more apparent from the following description of certain preferred embodiments in conjunction with the accompanying drawings, in which:

FIG. 14 is a diagram showing the waveforms of internal signals when the LOAD circuit shown in FIG. 11 operates in a reading mode.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
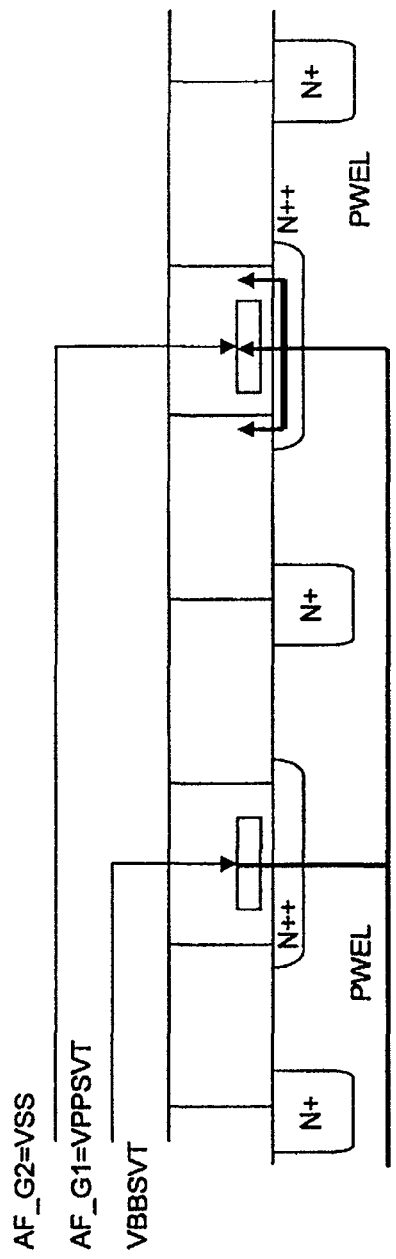
FIG. 1 is a diagram illustrative of problems posed when an excessively high voltage is applied to an anti-fuse element.
Figure 2:
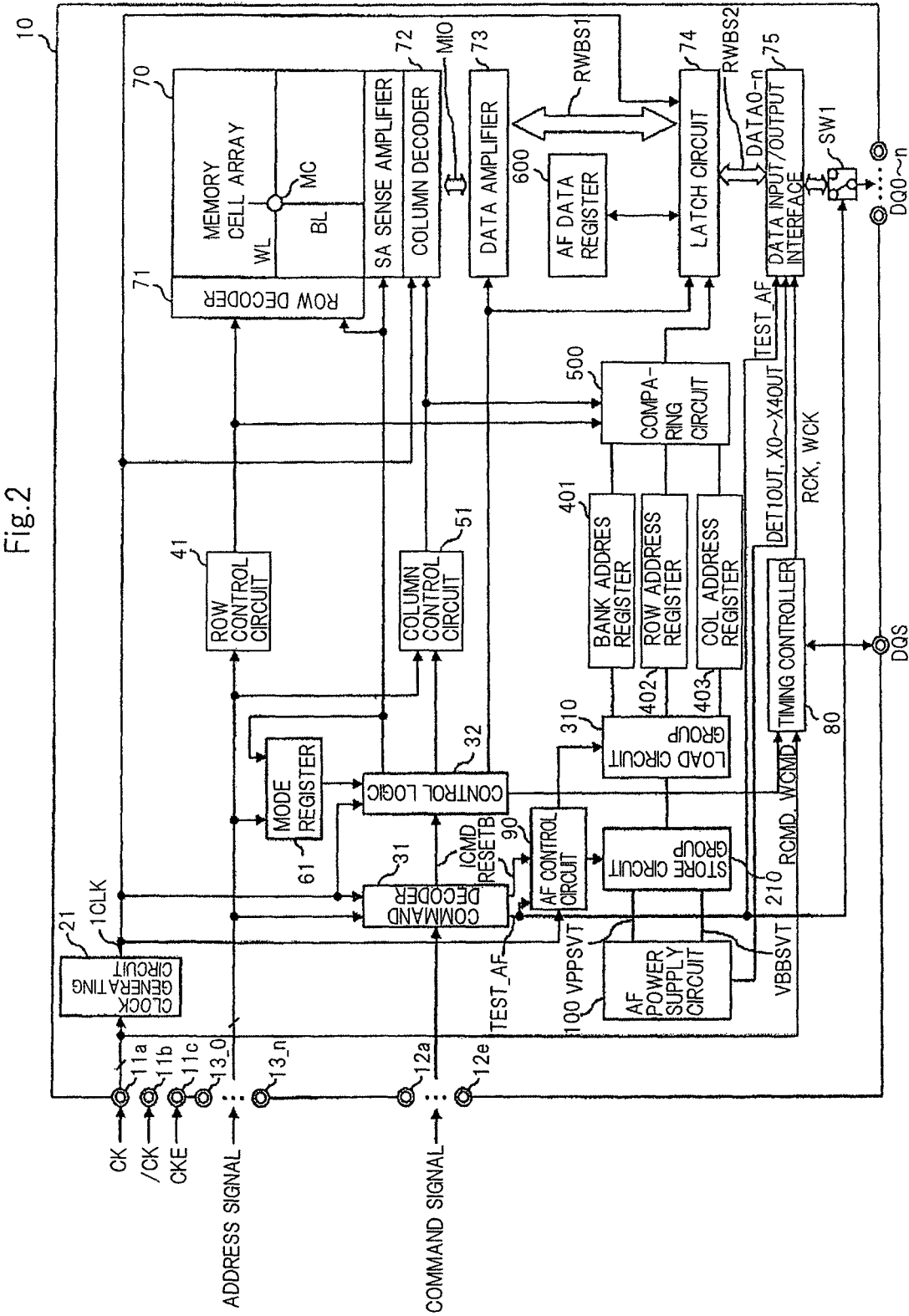
FIG. 2 is a block diagram of a semiconductor device according to an exemplary embodiment of the present invention.

Referring now to FIG. 2, semiconductor device 10 according to a first embodiment of the present invention includes clock pads 11a, 11b, clock enable pad 11c, command pads 12a through 12e, address pads 13_0 through 13_n, clock generating circuit 21, command decoder 31, control logic 32, row control circuit 41, column control circuit 51, mode register 61, memory cell array 70, row decoder 71, column decoder 72, data amplifier 73, latch circuit 74, data input/output interface 75, timing controller 80, AF control circuit 90, AF power supply circuit 100, STORE circuit group 210, LOAD circuit group 310, bank address register 401, ROW address register 402, COL address register 403, comparing circuit 500, AF data register 600, and switch SW1.

Clock pads 11a, 11b are supplied with external clock signals CK, /CK, respectively. Clock enable pad 11c is supplied with clock enable signal CKE. External clock signals CK, /CK supplied to clock pads 11a, 11b and clock enable signal CKE supplied to clock enable pad 11c are supplied to clock generating circuit 21 and timing controller 80. A signal which is indicated by a reference character with "/" means an inverted signal or low-active signal of a corresponding signal. Therefore, external clock signals CK, /CK are complementary to each other.

Clock generating circuit 21 generates internal clock signal ICLK based on external clock signals CK, /CK and clock enable signal CKE, and supplies generated internal clock signal ICLK to command decoder 31, control logic 32, column decoder 72, latch circuit 74, and AF control circuit 90.

Command pads 12a through 12e are supplied respectively with row address strobe signal/RAS, column address strobe signal/CAS, write enable signal/WE, chip select signal/CS, and on-die termination signal ODT. These command signals are supplied to command decoder 31.

Address pads 13_0 through 13_n are supplied with address signal ADD. Supplied address signal ADD is supplied via an address input circuit, not shown, to command decoder 31, row control circuit 41, column control circuit 51, and mode register 61. Specifically, in a normal mode of operation, a row address is supplied to row control circuit 41, and a column address is supplied to column control circuit 51. When there is an entry for mode register setting, address signal ADD is supplied to mode register 61 to update the contents of mode register 61.

Command decoder 31 operates in synchronism with internal clock signal ICLK supplied from clock generating circuit 21 to hold, decode, and count part of the command signals and the address signal, thereby generating various internal commands ICMD, and to supply generated internal commands ICMD to control logic 32.

Command decoder 31 also supplies signal TEST_AF to data input/output interface 75, AF control circuit 90, and switch SW1, and supplies signal RESETB to AF control circuit 90.

Control logic 32 operates in synchronism with internal clock signal ICLK supplied from clock generating circuit 21 to control the operation of various components of semiconductor device 10 depending on internal commands ICMD supplied from command decoder 31 and an output signal from mode register 61.

Row control circuit 41 supplies the row address supplied from address pads 13_0 through 13_n to row decoder 71 and comparing circuit 500.

Column control circuit 51 supplies the column address supplied from address pads 13_0 through 13_n to column decoder 72 and comparing circuit 500.

Mode register 61 stores operation modes of semiconductor device 10.

Memory cell array 70 comprises a matrix of memory cells MC at points of intersection of a plurality of word lines WL and a plurality of bit lines BL. FIG. 2 shows only one word line WL, one bit line BL, and one memory cell MC. Bit lines BL are connected to corresponding sense amplifiers SA.

Row decoder 71 selects any one of word lines WL of memory cell array 70.

Column decoder 72 selects any one of sense amplifiers SA. Sense amplifier SA selected by column decoder 72 is connected to data amplifier 73 by main I/O line MIO.

In a read mode, data amplifier 73 amplifies read data RD which have been amplified by sense amplifier SA, and supplies amplified read data RD to latch circuit 74 through read/write bus RWBS1. In a write mode, data amplifier 73 amplifies write data WD supplied from latch circuit 74 through read/write bus RWBS1, and supplies amplified write data WD to memory cell array 70.

Latch circuit 74 converts input and output data DATAO-n from parallel data to serial data and vice versa between data amplifier 73 and data input/output interface 75. Data are exchanged between latch circuit 74 and data input/output interface 75 through read/write bus RWBS2.

Data input/output interface 75 inputs and outputs input and output data DATA0-n between semiconductor device 10 and an external circuit through data terminals DQ0 through DQ n.

Timing controller 80 includes a DDL (Delay Locked Loop) circuit for controlling the input and output timing of data. In the read mode, timing controller 80 supplies data input/output interface 75 with read timing signal RCK for controlling the timing to read data in data input/output interface 75 depending on read command RCMD supplied from control logic 32 and external clock signals CK, /CK, and outputs data strobe signal DQS out of semiconductor device 10 through data strobe pad DQS. In the write mode, timing controller 80 supplies data input/output interface 75 with write timing signal WCK for controlling the timing to load write data in data input/output interface 75 depending on write command WCMD supplied from control logic 32, external clock signals CK, /CK, and data strobe signal DQS input from outside of semiconductor device 10 through data strobe pad DQS.

AF control circuit 90 is connected to command decoder 31, STORE circuit group 210, and LOAD circuit group 310. AF control circuit 90 receives signal RESETB and signal TEST_AF supplied from command decoder 31 and internal clock signal ICLK supplied from clock generating circuit 21, and supplies a control signal to STORE circuit group 210 and LOAD circuit group 310.

AF power supply circuit 100 supplies a write voltage to anti-fuse elements in a mode of writing information in the anti-fuse elements (STORE mode, also referred to as writing mode).

AF power supply circuit 100 also supplies data input/output interface 75 with a plurality of monitor signals DET1OUT, X0OUT through X4OUT indicative of results of a mode of verifying a written state of information in the anti-fuse elements (VERIFY mode, also referred to as verifying mode). Monitor signals DET1OUT, X0OUT through X4OUT supplied to data input/output interface 75 are output out of semiconductor device 10 through data terminals DQ0 through DQ5.

In the normal mode of operation, input/output data DATA0 through DATA5 are input and output through data terminals DQ0 through DQ5. In the verifying mode, switch SW1 is supplied with signal TEST_AF to output monitor signals DET1OUT, X0OUT through X4OUT from data input/output interface 75 through data terminals DQ0 through DQ5.

Data are written into anti-fuse elements when the addresses of faulty memory cells are programmed in order to rescue the faulty memory cells.

STORE circuit group 210 comprises a plurality of STORE circuits 200 (see FIG. 3) each having an anti-fuse element as a breakable element. Each of STORE circuits 200 performs the mode of writing data in its own anti-fuse element and the mode of verifying its own anti-fuse element.

LOAD circuit group 310 comprises a plurality of LOAD circuits 300 (see FIG. 3) each for implementing a mode to read information (e.g., data of the address of a faulty memory cell) stored in the anti-fuse element of a corresponding STORE circuit 200 (LOAD mode, also referred to as reading mode).

Bank address register 401 stores the bank address of a faulty memory cell read by LOAD circuit group 310.

ROW address register 402 stores the row address of a faulty memory cell read by LOAD circuit group 310.

COL address register 403 stores the column address of a faulty memory cell read by LOAD circuit group 310.

Comparing circuit 500 compares an address for which access has been requested and the addresses stored in the registers, and determines whether the memory cell identified by the address is to be rescued or not. If comparing circuit 500 determines that the memory cell is to be rescued, then comparing circuit 500 instructs latch circuit 74 to input data in and output data from AF data register 600.

AF data register 600 stores data to be read from and written in a faulty memory cell, in place of the faulty memory cell.

Figure 3:
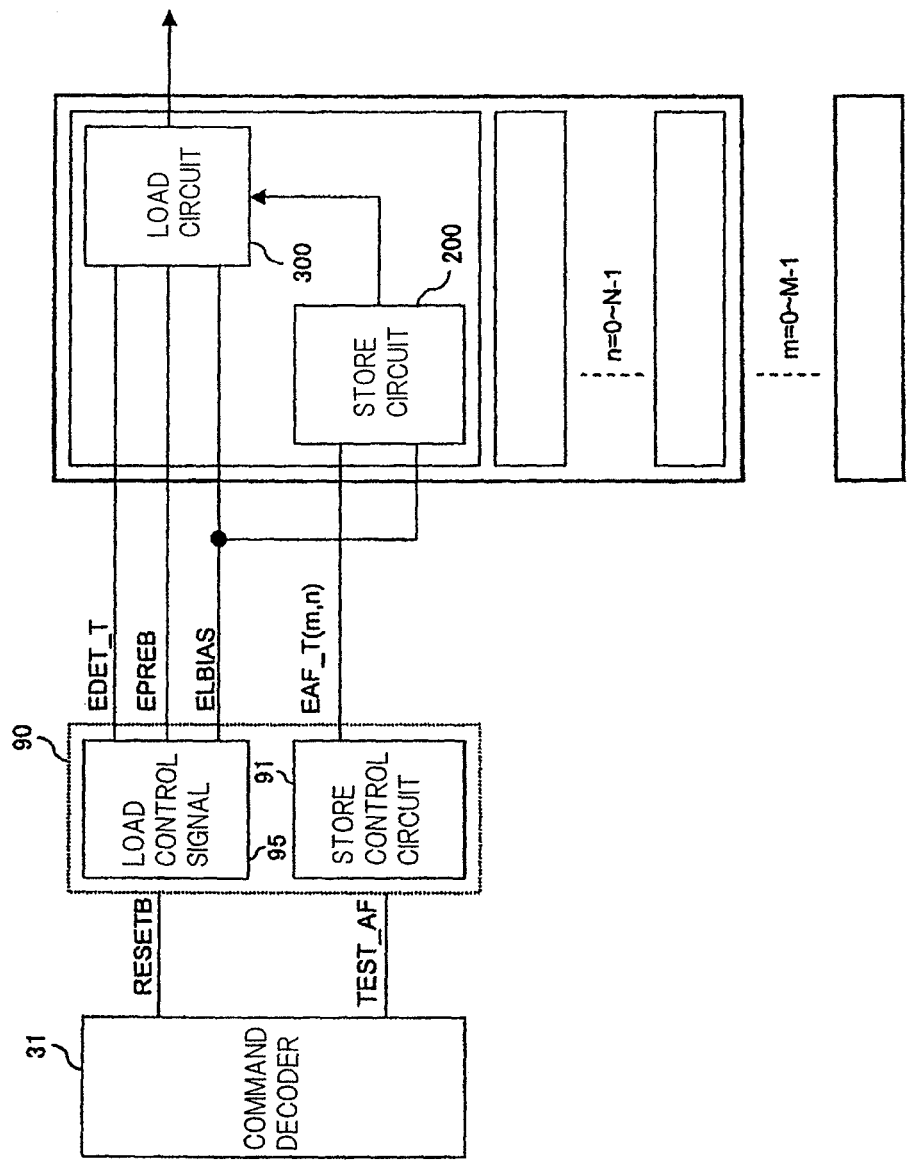
FIG. 3 is a block diagram illustrative of input signals supplied to an AF control circuit, a STORE circuit group, and a LOAD circuit group shown in FIG. 2.

FIG. 3 is a block diagram illustrative of input signals supplied to AF control circuit 90, STORE circuit group 210, and LOAD circuit group 310.

The address of one faulty memory cell needs to be stored by a plurality of anti-fuse elements. For example, if semiconductor device 10 is GDDR3-SDRAM X8 8bank, then the address of one faulty memory cell needs to be stored by a total of 25 anti-fuse elements including 3 anti-fuse elements for storing a bank address, 14 anti-fuse elements for storing a row address, 7 anti-fuse elements for storing a column address, and 1 Enable Fuse.

If the number of anti-fuse elements required to store the address of one faulty memory cell is represented by N, then since each STORE circuit 200 and each LOAD circuit 300 write data in and read data from one anti-fuse element, N STORE circuits 200 and N LOAD circuits 300 are required to store the address of one faulty memory cell. N STORE circuits 200 and N LOAD circuits 300 will hereinafter be collectively referred to as an anti-fuse set. An Enable Fuse is used to indicate whether the anti-fuse set including the Enable Fuse is used or not.

Usually, semiconductor device 10 includes a plurality of anti-fuse sets so as to be able to rescue a plurality of faulty memory cells. If the number of anti-fuse sets provided in semiconductor device 10 is represented by M, then semiconductor device 10 needs N*M STORE circuits 200 and N*M LOAD circuits 300 in order to store the addresses of faulty memory cells, as shown in FIG. 3.

AF control circuit 90 comprises STORE control circuit 91 and LOAD control circuit 95.

When STORE control circuit 91 is supplied with internal clock signal ICLK from clock generating circuit 21 and signal TEST_AF and signal RESETB supplied from command decoder 31, STORE control circuit 91 outputs active-level signal EAF_T(m,n) to STORE circuits 200 having anti-fuse element to be written in order to connect STORE circuit 200 having anti-fuse element to be written and AF power supply circuit 100 to each other.

The values of m, n representing STORE circuits 200 are determined from the number of faulty memory cells that have been found when assembled semiconductor device 10 has been sorted out and from the address of faulty memory cell.

When LOAD control circuit 95 is supplied with signal RESETB from command data 31, LOAD control circuit 95 causes signal EDET_T, signal EPREB, and signal ELBIAS to become an active level, outputs signal EDET_T and signal EPREB to a plurality of LOAD circuits 300, and outputs signal ELBIAS to a plurality of STORE circuits 200 and a plurality of LOAD circuits 300.

Figure 4:
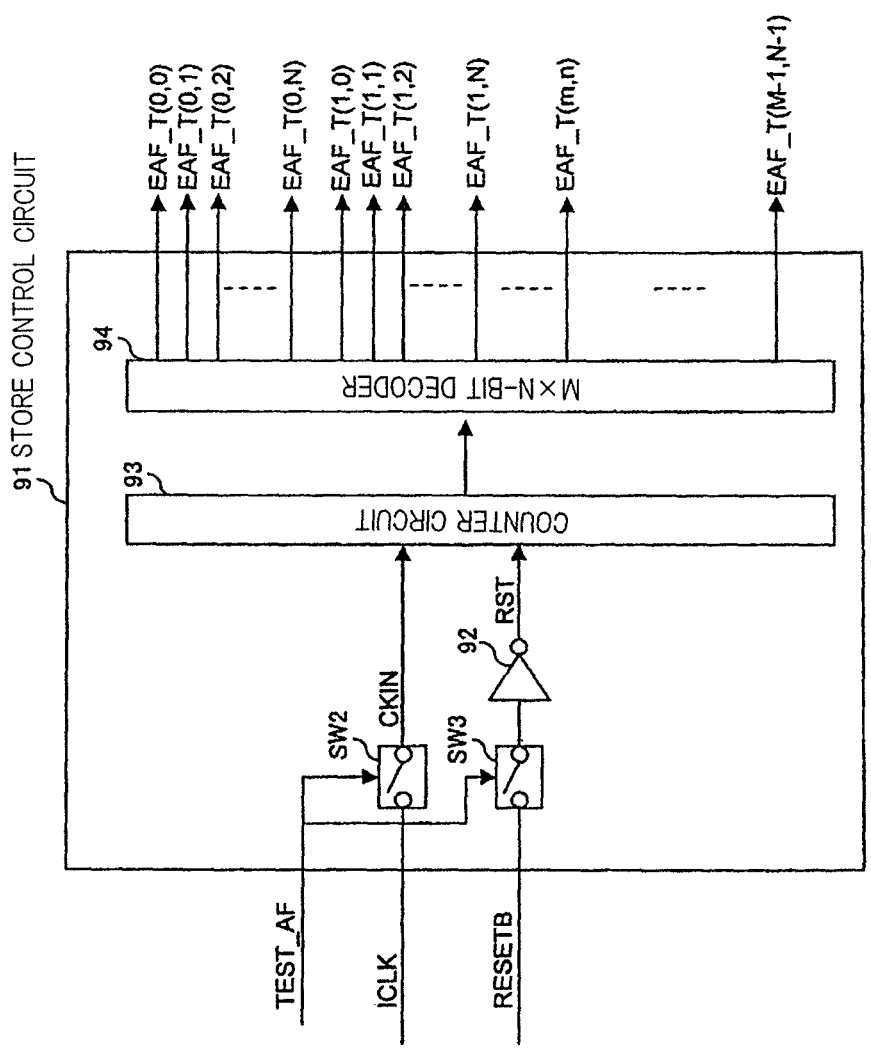
FIG. 4 is a block diagram of a STORE control circuit shown in FIG. 3.

FIG. 4 is a block diagram of STORE control circuit 91.

As shown in FIG. 4, STORE control circuit 91 comprises inverter 92, counter circuit 93, M*N-bit decoder 94, and switches SW2, SW3.

When signal TEST_AF is input to STORE control circuit 91, it turns on switches SW2, SW3. When switch SW2 is turned on, it introduces internal clock signal ICLK into STORE control circuit 91, and outputs internal clock signal ICLK as clock signal CKIN to counter circuit 93. When switch SW3 is turned on, it introduces signal RESETB into STORE control circuit 91.

Inverter 92 inverts introduced signal RESETB into signal RST, and outputs signal RST to counter circuit 93.

Based on the values of m, n that are determined based on STORE circuit 200 whose anti-fuse element is to be written, counter circuit 93 is supplied with clock signal CKIN of (m*N)+n+1 pulses and outputs a count corresponding to supplied clock signal CKIN.

M*N-bit decoder 94 causes signal EAF_T(m,n) that depends on the count output from counter circuit 93 to become an active level, and outputs active signal EAF_T(m, n) to STORE circuit 200 whose anti-fuse element is to be written.

Circuit arrangements of AF power supply circuit 100 and STORE circuits 200 will be described below.

Figure 5:
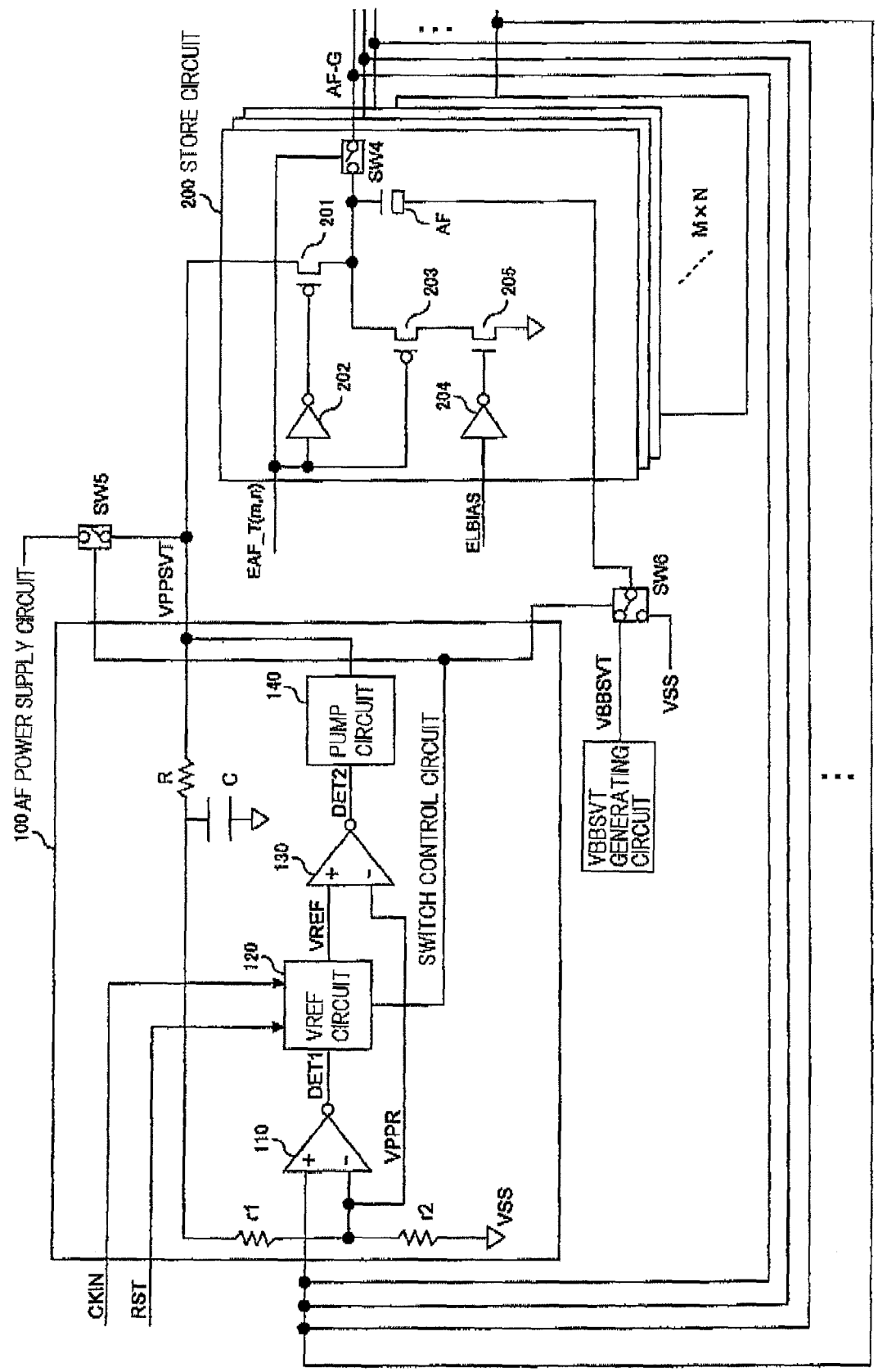
FIG. 5 is a block diagram of an AF power supply circuit and STORE circuits shown in FIG. 2.
Figure 6:
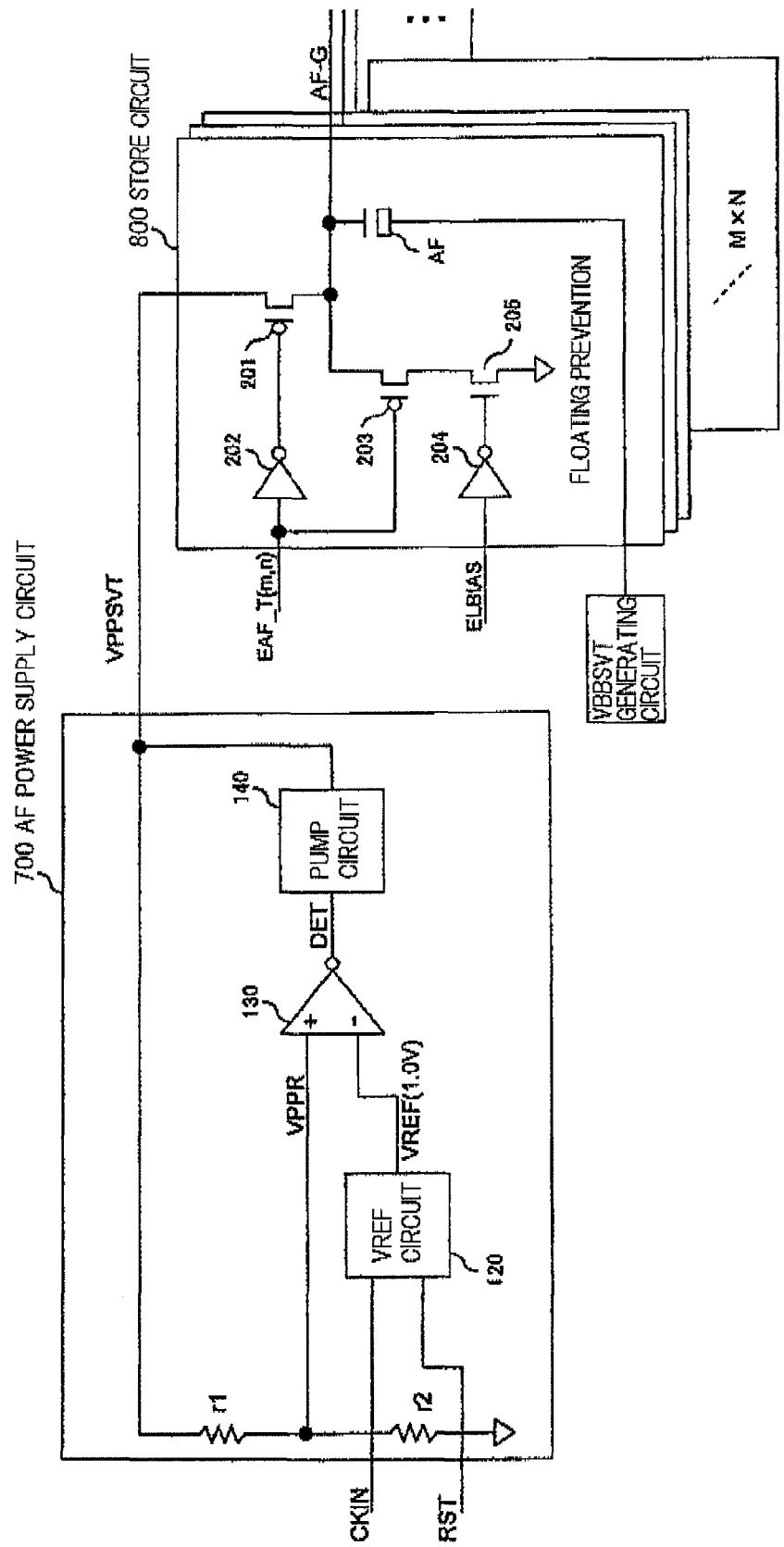
FIG. 6 is a block diagram of an AF power supply circuit and STORE circuits according to the related art.

FIG. 5 is a block diagram of AF power supply circuit 100 and STORE circuits 200. For comparison, FIG. 6 shows AF power supply circuit 700 and STORE circuits 800 according to the related art. Those parts shown in FIG. 6 which are identical to those shown in FIG. 5 are denoted by identical reference characters.

First, the circuit arrangement of AF power supply circuit 100 will be described below. As shown in FIG. 5, AF power supply circuit 100 comprises resistors R, r1, r2, capacitor C, comparing circuits 110, 130, VREF circuit 120, and PUMP circuit 140. AF power supply circuit 100 is different from AF power supply circuit 700 shown in FIG. 6 in that it additionally has resistor R, capacitor C, and comparing circuit 110.

Resistor R has an end connected to power supply line VPPSVT as a first power supply line and the other end connected to an end of capacitor C and an end of resistor r1.

Resistor r1 has the end connected to the other end of resistor R and the end of capacitor C, and the other end connected to an end of resistor r2.

Resistor r2 has the end connected to the other end of resistor r1 and comparing circuit 110 and the other end connected to a power supply line at ground potential VSS which serves as a third power supply line.

Comparing circuit 110 has an input terminal (+) connected to ends of the anti-fuse elements of respective STORE circuits 200 through respective switches SW4 of STORE circuits 200, another input terminal (−) connected to the junction between resistors r1, r2, and an output terminal connected to VREF circuit 120. When switch SW4 of STORE circuit 200 whose anti-fuse element is to be written is turned on and switches SW4 of other STORE circuits 200 are turned off, the end of the anti-fuse element to be written is connected to the input terminal (+) of comparing circuit 110. Then, comparing circuit 110 compares potential AF_G at the end of the anti-fuse element to be written with potential VPPR as a first potential. If potential AF_G is equal to or higher than potential VPPR, then comparing circuit 110 outputs high-level signal DET1 to VREF circuit 120. If potential AF_G is lower than potential VPPR, then comparing circuit 110 outputs low-level signal DET1 to VREF circuit 120.

Potential VPPR is generated by dividing the potential difference between the potential of power supply line VPPSVT and ground potential VSS, and is determined by the resistance values of resistors R, r1, r2.

When the anti-fuse element is rendered conductive, potential AF_G drops. Therefore, by pre-adjusting the resistance values of resistors R, r1, r2 to set potential VPPR such that comparing circuit 110 produces different results before and after potential AF_G drops, comparing circuit 110 can determine whether the anti-fuse element is rendered conductive or not by comparing potential AF_G and potential VPPR with each other.

VREF circuit 120 is supplied with signal CKIN and signal RST from STORE control circuit 91 and with signal DET1 from comparing circuit 110, and outputs reference potential VREF to comparing circuit 130. VREF circuit 120 also outputs a switch control signal for actuating switches SW5, SW6 to be described later. Details of VREF circuit 120 will be described later.

Comparing circuit 130 compares reference potential VREF and potential VPPR with each other. If reference potential VREF is equal to or higher than potential VPPR, then comparing circuit 130 outputs high-level signal DET2 to PUMP circuit 140. If reference potential VREF is lower than potential VPPR, then comparing circuit 130 outputs low-level signal DET2 to PUMP circuit 140.

If PUMP circuit 140 is supplied with high-level signal DET2 from comparing circuit 130, then PUMP circuit 140 boosts potential VPPSVT of power supply line VPPSVT. If PUMP circuit 140 is supplied with low-level signal DET2 from comparing circuit 130, then PUMP circuit 140 stops boosting potential VPPSVT of power supply line VPPSVT. Details of PUMP circuit 140 will be described later.

In the writing mode, the potential of power supply line VPPSVT becomes potential VPPSVT applied by PUMP circuit 140. In the verifying mode, the potential of power supply line VPPSVT becomes, for example, potential VPERI as a second potential by actuating switch SW5.

The circuit arrangement of each STORE circuit 200 will be described below. As shown in FIG. 5, each STORE circuit 200 comprises anti-fuse element AF, P-type transistors 201, 203, inverters 202, 204, N-type transistor 205, and switch SW4. STORE circuit 200 is different from STORE circuit 800 shown in FIG. 6 in that it additionally has switch SW4.

Anti-fuse element AF has an end connected to the drain of P-type transistor 201 and switch SW4 which is turned on by active-level signal EAF_T(m,n) and the other end connected to power supply line VBBSVT at potential VBBSVT which serves as a second power supply line in the writing mode or power supply line at ground potential VSS in the verifying mode by actuating switch SW6.

P-type transistor 201 has a gate connected to the output terminal of inverter 202, a source connected to power supply line VPPSVT, and a drain connected to the end of anti-fuse element AF and the source of P-type transistor 203.

Inverter 202 is supplied with signal EAF_T(m,n), and inverts supplied signal EAF_T(m,n) and outputs the inverted signal to P-type transistor 201.

P-type transistor 203 has a gate connected to STORE control circuit 91 which outputs signal EAF_T(m,n), a source connected to the end of anti-fuse element AF and the drain of P-type transistor 201, and a drain connected to the source of N-type transistor 205.

Inverter 204 is supplied with signal ELBIAS, and inverts supplied signal ELBIAS and outputs the inverted signal to N-type transistor 205.

N-type transistor 205 has a gate connected to the output terminal of inverter 204, a source connected to the drain of P-type transistor 203, and a drain connected to the ground potential.

In the writing mode, P-type transistor 201 is turned on, connecting the end of anti-fuse element AF to power supply line VPPSVT, with the other end thereof being connected to power supply line VBBSVT through switch SW6. When the insulating film of anti-fuse element AF breaks down, the end of anti-fuse element AF and the other end thereof are connected to each other. N-type transistor 205 is provided to prevent the end of anti-fuse element AF from floating.

In the verifying mode, the switch control signal turns on switch SW5, causing the potential of power supply line VPPSVT to become potential VPERI. The switch control signal actuates switch SW6 to connect the other end of anti-fuse element AF to the power supply line at ground potential VSS.

The circuit arrangement of VREF circuit 120 will be described below.

Figure 7:
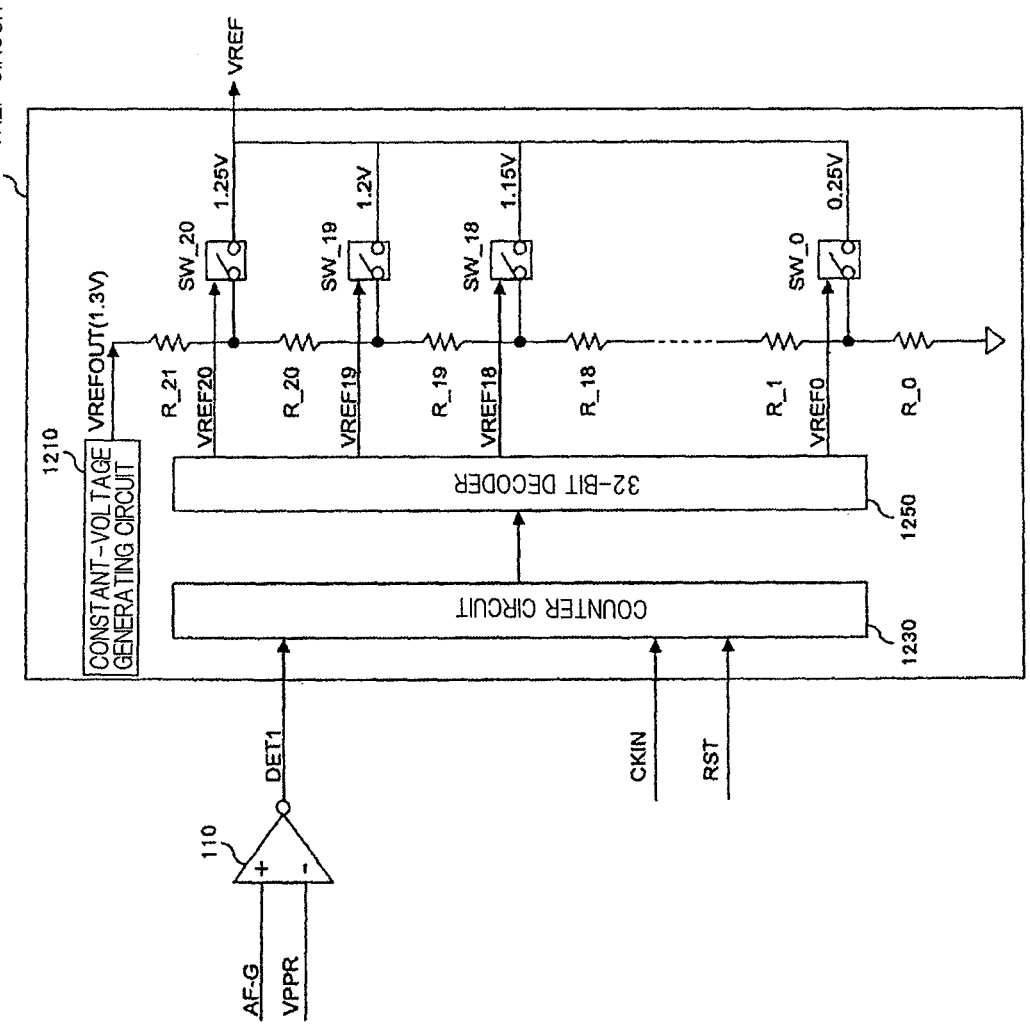
FIG. 7 is a block diagram of a VREF circuit shown in FIG. 5.

FIG. 7 is a block diagram of VREF circuit 120.

As shown in FIG. 7, VREF circuit 120 comprises constant-voltage generating circuit 1210, counter circuit 1230, 32-bit decoder 1250, resistors R_0 through R_21, and switches SW_0 through SW_20.

Resistors R_0 through R_21 are connected in series with each other. Resistor R_21 has an end connected to constant-voltage generating circuit 1210, and resistor R_0 has an end connected to the ground potential.

Switches SW_0 through SW_20 are connected respectively to the junctions between resistors R_0 through R_21.

Constant-voltage generating circuit 1210 generates constant voltage VREFOUT. It is assumed that constant voltage VREFOUT is of 1.3 V.

When counter circuit 1230 is supplied with high-level signal DET1 from comparing circuit 110, counter circuit 1230 increments its count by 1 in the range from 0 to 20, and outputs the count to 32-bit decoder 1250. When counter circuit 1230 is supplied with low-level signal DET1 from comparing circuit 110, counter circuit 1230 outputs 0 as its count to 32-bit decoder 1250. Details of counter circuit 1230 will be described later.

32-bit decoder 1250 causes any one of signals VREF0 through VREF20 which corresponds to the count output from counter circuit 1230 high to become an active level, and outputs signals VREF0 through VREF20 respectively to switches SW_0 through SW_20. Switches SW_0 through SW_20 are rendered conductive when corresponding signals VREF0 through VREF20 become active level signals, and are rendered non-conductive when corresponding signals VREF0 through VREF20 become inactive level signals.

If the count output from counter circuit 1230 is 0, then 32-bit decoder 1250 causes signal VREF0 to become an active (high) level signal, and outputs active-level signal VREF0 to switch SW_0 which is connected to the junction between resistor R_0 and resistor R_1. Active-level signal VREF0 turns on switch SW_0, which outputs the potential (0.25 V) at the junction between resistor R_0 and resistor R_1 as reference potential VREF. Remaining switches SW_1 through SW_20 are supplied with inactive-level (low-level) signals VREF1 through VREF20, respectively, and are turned off.

The potential at the junction between two of resistors R_0 through R_21 is generated by dividing constant voltage VREFOUT at a ratio which is determined by the resistance value of the resistors which are connected to the junction toward constant-voltage generating circuit 1210 and the resistance value of the resistors which are connected to the junction toward the ground potential. In FIG. 7, the resistance values of resistors R_0 through R_21 are selected such that the potentials at the junctions successively vary at an interval of 0.05 V.

The circuit arrangement of counter circuit 1230 will be described below.

Figure 8:
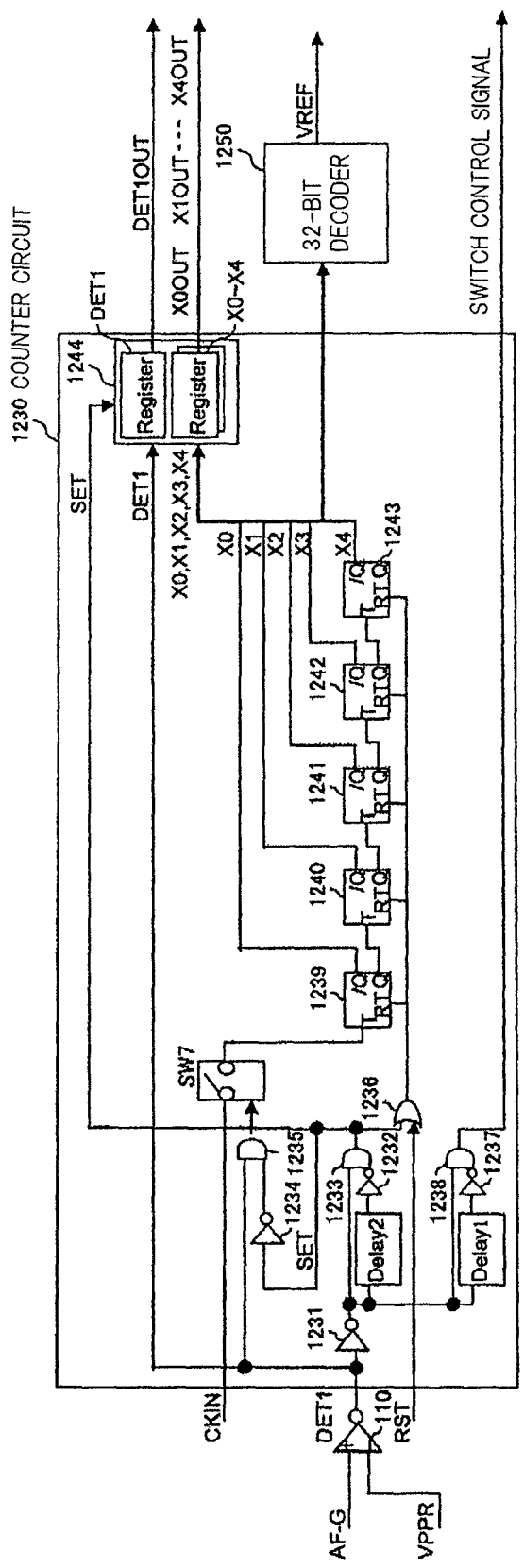
FIG. 8 is a block diagram of a counter circuit shown in FIG. 7.

FIG. 8 is a block diagram of counter circuit 1230.

As shown in FIG. 8, counter circuit 1230 comprises inverters 1231, 1232, 1234, 1237, AND gates 1233, 1235, 1238, OR gate 1236, delay circuits Delay 1, Delay 2, switch SW7, flip-flops 1239 through 1243, and register 1244.

Inverter 1231 is supplied with signal DET1 from comparing circuit 110, inverts supplied signal DET1, and outputs the inverted signal to AND gates 1233, 1238 and delay circuits Delay 1, Delay 2.

Delay circuit Delay 1 delays the signal output from inverter 1231 by time delay 1 and outputs the delayed signal to inverter 1237.

Delay circuit Delay 2 delays the signal output from inverter 1231 by time delay 2 and outputs the delayed signal to inverter 1232.

Inverter 1232 inverts the signal output from delay circuit Delay 2 and outputs the delayed signal to AND gate 1233.

AND gate 1233 ANDs the signal output from inverter 1231 and the signal output from inverter 1232, and outputs the resultant signal as signal SET to inverter 1234, OR gate 1236, and register 1244.

Consequently, delay circuit Delay 2, inverter 1232, and AND gate 1233 change signal SET from a low level as an inactive level to a high level as an active level when signal DET1 changes from a high level as one logic level to a low level as another logic level. After having changed signal SET to the high level, delay circuit Delay 2, inverter 1232, and AND gate 1233 change signal SET from the high level back to the low level after the delay time of delay circuit Delay 2 has elapsed or when signal DET1 changes from the low level back to the high level.

Inverter 1234 inverts signal SET output from AND gate 1233 and outputs the inverted signal to AND gate 1235.

AND gate 1235 ANDs signal DET1 output from comparing circuit 110 and the signal output from inverter 1234 and outputs the resultant signal to switch SW7.

Switch SW7 controls the supply of clock signal CKIN to flip-flop 1239 to be described later, depending on the logic levels of signal DET1 and signal SET. Specifically, only when signal DET1 is of a high level and signal SET is of a low level, is switch SW7 turned on, thereby supplying clock signal CKIN to flip-flop 1239. When signal SET is of a high level or signal DET1 is of a low level, switch SW7 is turned off, thereby stopping supplying clock signal CKIN to flip-flop 1239.

OR gate 1236 ORs signal SET output from AND gate 1233 and signal RST supplied from inverter 92 shown in FIG. 4, and outputs the resultant signal as reset signal RSTC to respective resetting terminals RT of flip-flops 1239 through 1243.

Inverter 1237 inverts the signal output from delay circuit Delay 1 and outputs the inverted signal to AND gate 1238.

AND gate 1238 ANDs the signal output from inverter 1231 and the signal output from inverter 1237 and outputs the resultant signal as a switch control signal to switches SW5, SW6.

Consequently, delay circuit Delay 1, inverter 1237, and AND gate 1238 change the switch control signal from a low level as an inactive level to a high level as an active level when signal DET1 changes from a high level as one logic level to a low level as another logic level. After having changed the switch control signal to the high level, delay circuit Delay 1, inverter 1237, and AND gate 1238 change the switch control signal from the high level back to the low level after the delay time of delay circuit Delay 1 has elapsed or when signal DET1 changes from the low level back to the high level.

Flip-flop 1239 has input terminal T connected to switch SW7 so that input terminal T is supplied with clock signal CKIN when switch SW is turned on. Flip-flop 1239 has output terminal Q connected to input terminal T of flip-flop 1240 and output terminal/Q connected to register 1244 and 32-bit decoder 1250.

Flip-flop 1240 has input terminal T connected to output terminal Q of flip-flop 1239, output terminal Q connected to input terminal T of flip-flop 1241, and output terminal/Q connected to register 1244 and 32-bit decoder 1250.

Flip-flop 1241 has input terminal T connected to output terminal Q of flip-flop 1240, output terminal Q connected to input terminal T of flip-flop 1242, and output terminal/Q connected to register 1244 and 32-bit decoder 1250.

Flip-flop 1242 has input terminal T connected to output terminal Q of flip-flop 1241, output terminal Q connected to input terminal T of flip-flop 1243, and output terminal/Q connected to register 1244 and 32-bit decoder 1250.

Flip-flop 1243 has input terminal T connected to output terminal Q of flip-flop 1242 and output terminal/Q connected to register 1244 and 32-bit decoder 1250.

Flip-flops 1239 through 1243 jointly make up a 5-bit counter and have their output signals changed, incrementing count by 1 per clock period of clock signal CKIN. Flip-flops 1239 through 1243 have respective resetting terminals RT supplied with resetting signal RSTC from OR gate 1236. When resetting signal RSTC becomes a high level signal, flip-flops 1239 through 1243 reset data held thereby to a low level (count of 0).

Register 1244 includes register DET1 and registers X0 through X4. Register DET1 is supplied with signal DET1 output from comparing circuit 110, and registers X0 through X4 are supplied with respective signals X0, X1, X2, X3, X4 output from respective output terminals/Q of flip-flops 1239 through 1243. When signal SET changes from a high level to a low level, register DET1 stores signal DET1 and outputs stored DET1 as monitor signal DET1OUT from data terminal DQ1 shown in FIG. 2 from semiconductor device 10. When signal SET changes from the low level to the high level, registers X0 through X4 store signals X0, X1, X2, X3, X4 respectively therein and output stored signals X0, X1, X2, X3, X4 as monitor signals X0OUT, X1OUT, X2OUT, X3OUT, X4OUT from data terminals DQ1 through DQ5 shown in FIG. 2 from semiconductor device 10.

As can be seen from the circuit arrangement shown in FIG. 8, the time at which signal SET is supplied to registers X0 through X4 is earlier than the time at which resetting signal RSTC generated from signal SET is supplied to respective resetting terminals RT of flip-flops 1239 through 1243, by the number of logic stages of OR gate 1236. Therefore, registers X0 through X4 can store the count before flip-flops 1239 through 1243 are initialized, and output the stored count from semiconductor device 10.

The circuit arrangement of PUMP circuit 140 will be described below.

Figure 9:
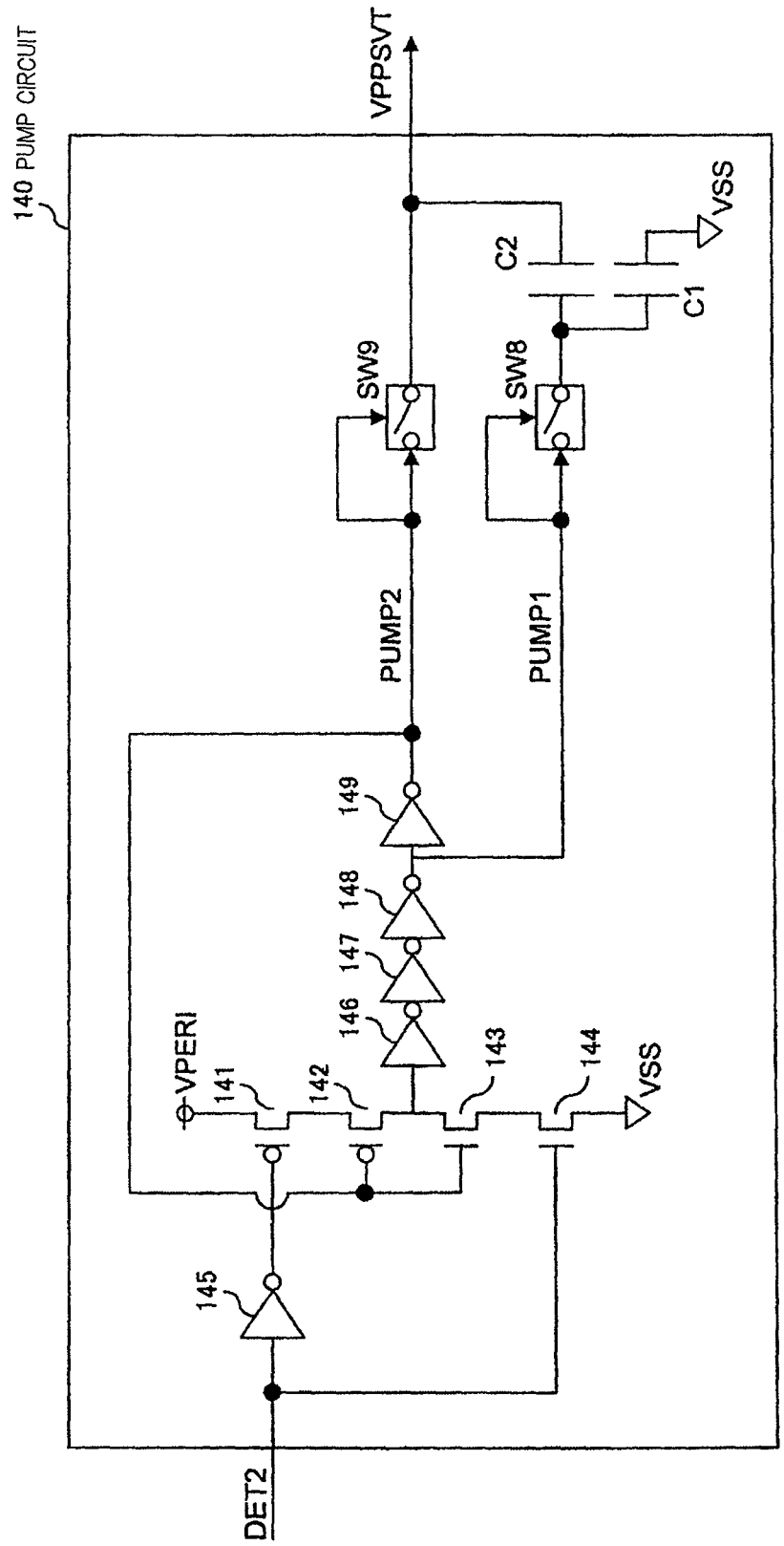
FIG. 9 is a block diagram of a PUMP circuit shown in FIG. 5.

FIG. 9 is a block diagram of PUMP circuit 140.

As shown in FIG. 9, PUMP circuit 140 comprises P-type transistors 141, 142, N-type transistors 143, 144, inverters 145 through 149, switches SW8, SW9, and capacitors C1, C2.

P-type transistor 141 has a gate connected to the output terminal of inverter 145, a source connected to the power supply line at potential VPERI as a first prescribed potential, and a drain connected to the source of P-type transistor 142.

P-type transistor 142 has a gate connected to the output terminal of inverter 149, a source connected to the drain of P-type transistor 141, and a drain connected to the source of N-type transistor 143 and inverter 146.

N-type transistor 143 has a gate connected to the output terminal of inverter 149, a source connected to the drain of P-type transistor 142, and a drain connected to the source of N-type transistor 143.

N-type transistor 144 has a gate connected to comparing circuit 130, a source connected to the drain of N-type transistor 143, and a drain connected to ground potential VSS.

Inverter 145, which is connected to comparing circuit 130, inverts signal DET2 output from comparing circuit 130 and outputs the inverted signal to P-type transistor 141.

Inverter 146 inverts the output signal from P-type transistor 142 or N-type transistor 143, and outputs the inverted signal to inverter 147.

Inverter 147 inverts input signals and outputs the inverted signals to inverter 148.

Inverter 148 inverts input signals and outputs the inverted signals to inverter 149. The output signal from inverter 148 is also supplied as signal PUMP1 to switch SW8.

Inverter 149 inverts the input signal and outputs the inverted signal to P-type transistor 142 and N-type transistor 143. The output signal from inverter 149 is also supplied as signal PUMP2 to switch SW9.

Figure 10:
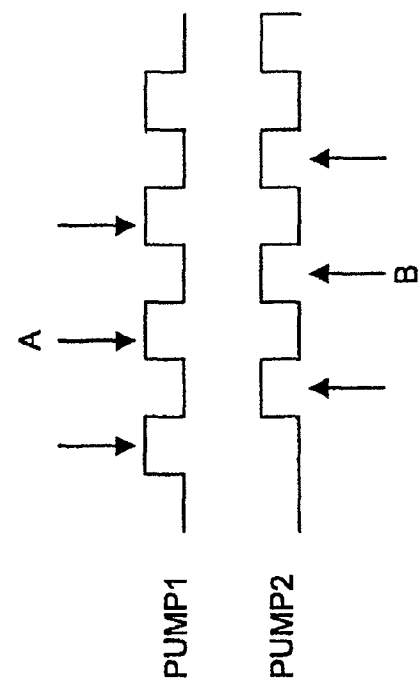
FIG. 10 is a diagram illustrative of a boosting process carried out by the PUMP circuit shown in FIG. 9.

When PUMP circuit 140 is supplied with high-level signal DET2 from comparing circuit 130, signals PUMP1, PUMP2 alternately change repeatedly between a high level and a low level, as shown in FIG. 10. It is assumed below that a high-level state of signal PUMP1 is referred to as state A and a high-level state of signal PUMP2 as state B.

In state A, switch SW8 is turned on and switch SW9 is turned off, storing electric charges in capacitors C1, C2. In state B, switch SW8 is turned off and switch SW9 is turned on, allowing the electric charges stored in capacitors C1, C2 to boost potential VPPSVT from an initial potential (=VPERI).

When PUMP circuit 140 is supplied with low-level signal DET2 from comparing circuit 130, signals PUMP1, PUMP2 stop changing their levels to stop boosting potential VPPSVT. Potential VPPSVT drops due to a leakage of the electric charges.

The circuit arrangement of LOAD circuit 300 shown in FIG. 3 will be described below.

Figure 11:
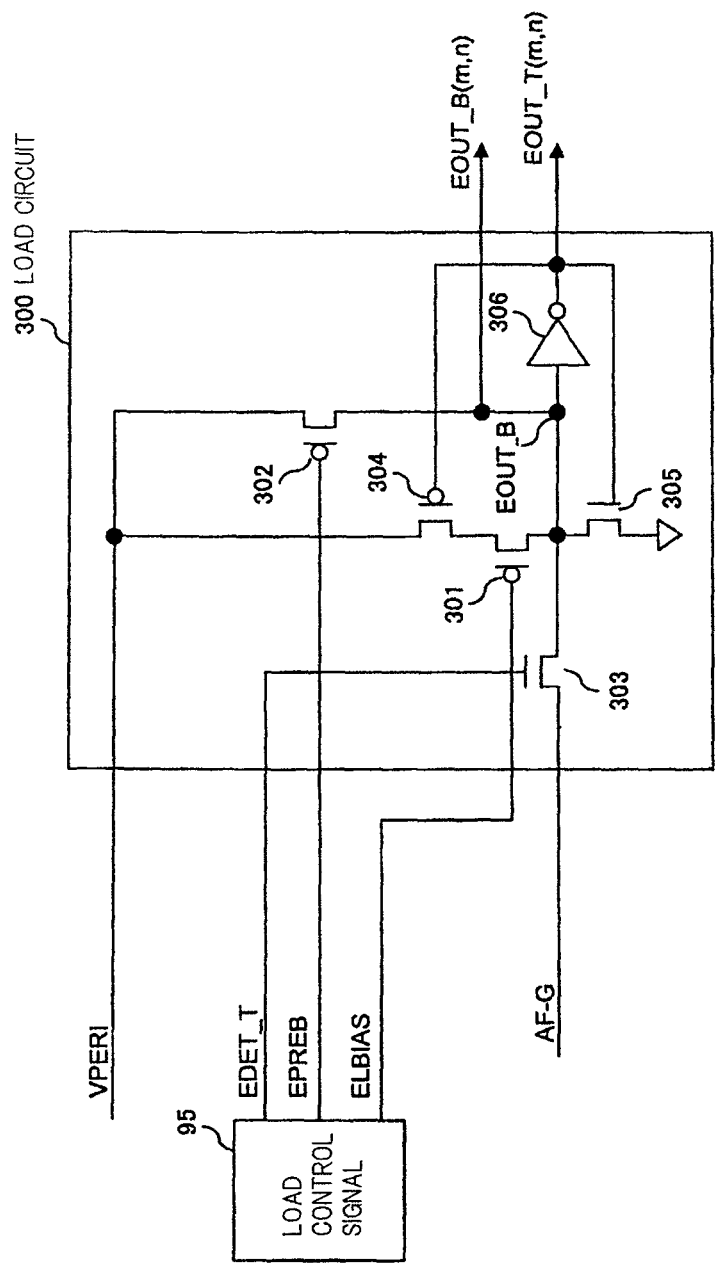
FIG. 11 is a block diagram of a LOAD circuit shown in FIG. 3.

FIG. 11 is a block diagram of LOAD circuit 300.

As shown in FIG. 11, LOAD circuit 300 comprises P-type transistors 301, 302, 304, N-type transistors 303, 305, and inverter 306.

P-type transistor 301 has a gate connected to LOAD control circuit 95 so that the gate is supplied with signal ELBIAS, a source connected to the drain of P-type transistor 304, and a drain connected to the drain of N-type transistor 303 and the source of N-type transistor 305.

P-type transistor 302 has a gate connected to LOAD control circuit 95 so that the gate is supplied with signal EPREB, a source connected to power supply line VPERI, and a drain connected to inverter 306.

N-type transistor 303 has a gate connected to LOAD control circuit 95 so that the gate is supplied with signal EDET_T, a source connected to an end of the anti-fuse element, and a drain connected to the drain of P-type transistor 301 and the source of N-type transistor 305.

P-type transistor 304 has a gate connected to the output terminal of inverter 306, a source connected to power supply line VPERI, and a drain connected to the source of P-type transistor 301.

N-type transistor 305 has a gate connected to the output terminal of inverter 306, a source connected to the drain of P-type transistor 301 and the drain of N-type transistor 303, and a drain connected to the ground potential.

Inverter 306 inverts potential (High, Low) of node EOUT_B and outputs the inverted potential as signal EOUT_T(m,n). Potential (High, Low) of node EOUT_B is directly output as EOUT_B(m,n) from LOAD circuit 300.

The writing mode of operation and the verifying mode of operation of semiconductor device 10 according to the present exemplary embodiment will be described below.

Figure 12:
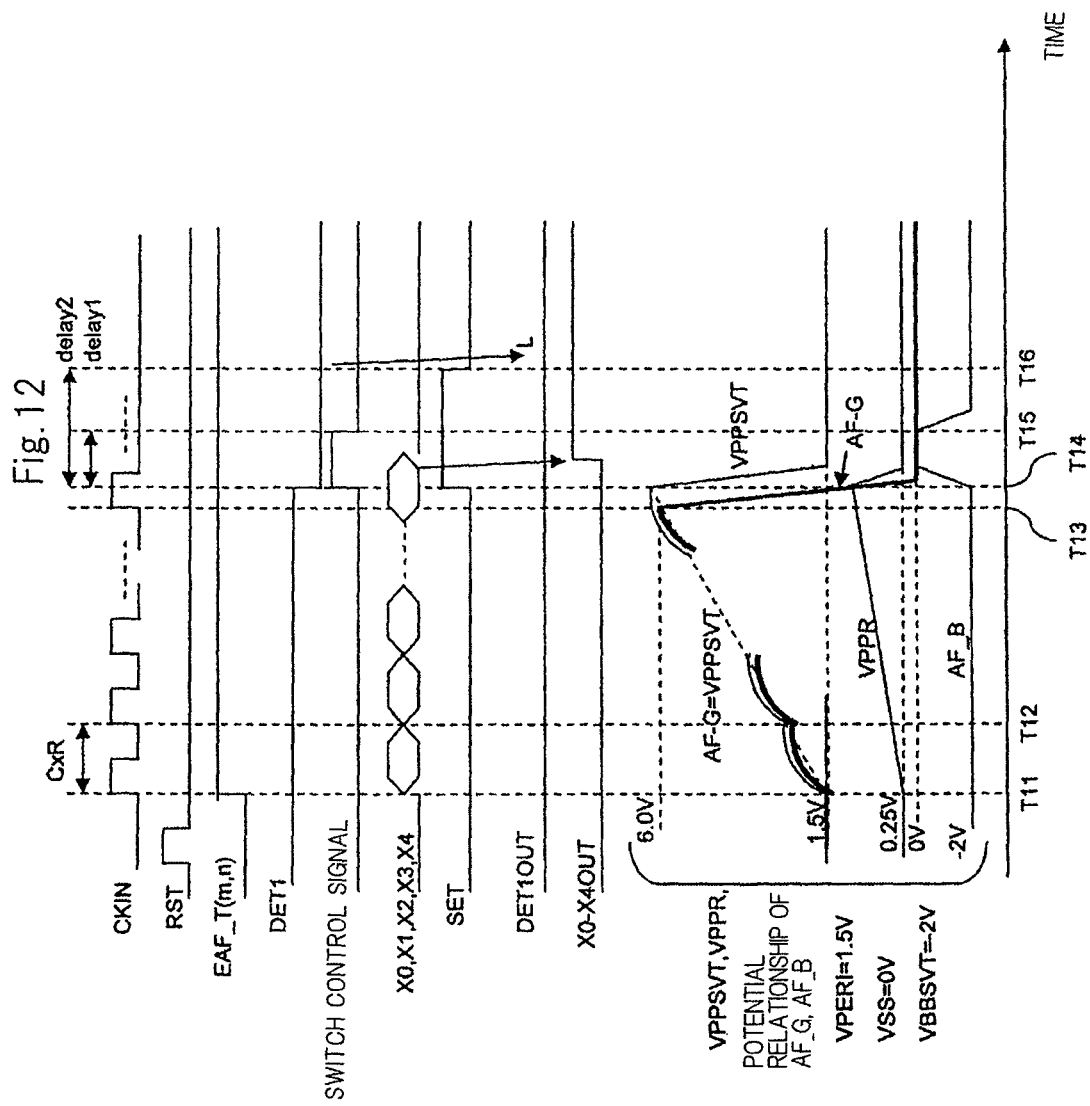
FIG. 12 is a diagram showing the waveforms of internal signals and the waveforms of monitor signals of verified results when the semiconductor device shown in FIG. 2 writes data normally.

FIG. 12 is a diagram showing the waveforms of internal signals and the waveforms of monitor signals of verified results when semiconductor device 10 according to the present exemplary embodiment writes data normally.

Inverter 92 in STORE control circuit 91 activates signal RST for a prescribed time thereby resetting the counts of counter circuit 93 in STORE control circuit 91 and counter circuit 1230 in VREF circuit 120 in AF power supply circuit 100.

At time T11, STORE control circuit 91 activates signal EAF_T(i,j) which designates an anti-fuse element to be written, from among a plurality of signals EAF_T(m,n), inactivates remaining signals EAF_T(m,n), and supplies those signals respectively to a plurality of STORE circuits 200. In the description which follows, STORE circuit 200ij including an anti-fuse element to be written, among STORE circuits 200, will be described.

When signal EAF_T(i,j) is activated, switch SW4 in STORE circuit 200ij is turned on to connect STORE circuit 200ij to AF power supply circuit 100. Since the switch control signal is low level at time T11, potential VPPSVT (=1.5 V) in an initial state of PUMP circuit 140 in AF power supply circuit 100 as a second prescribed potential is applied to an end of the anti-fuse element of STORE circuit 200ij, and potential VBBSVT (=−2 V) is applied to the other end of the anti-fuse element. Potential AF_G remains equal to potential VPPSVT until the anti-fuse element is rendered conductive. Since potential AF_G is equal to or higher than potential VPPR, comparing circuit 110 outputs high-level signal DET1 to VREF circuit 120.

At time T12, which is one clock period after time T11, comparing circuit 110 outputs low-level signal DET1, causing counter circuit 1230 to increment its count by 1 and output the incremented count. As the count is incremented, potential VPPSVT is boosted.

The clock period of clock signal CKIN is determined by the resistance value of resistor R and the capacitance value of capacitor C in AF power supply circuit 100. By reducing the clock period of clock signal CKIN, the time required by the STORE mode and the LOAD mode can be shortened.

Potential VPPSVT is repeatedly boosted until it reaches 6.0 V at time T13. It is assumed in FIG. 12 that the anti-fuse element to be written is rendered conductive, i.e., the writing of data therein is completed, at time T13. In the present exemplary embodiment, the value of potential VPPSVT at which the anti-fuse element to be written is rendered conductive is not limited to 6.0 V. If the anti-fuse element to be written is rendered conductive at 5.0 V due to fabrication process variations or the like, for example, then potential VPPSVT stops being boosted when it reaches 5.0 V. If the anti-fuse element to be written is not rendered conductive at 6.0 V, then potential VPPSVT is repeatedly boosted to a voltage higher than 6.0 V.

When potential AF_G at the end of the anti-fuse element to be written becomes lower than potential VPPR, comparing circuit 110 changes signal DET1 from a high level to a low level at time T14 in the same clock period as time T13.

When signal DET1 changes from the high level to the low level, delay circuit Delay 2, inverter 1232, and AND gate 1233 in counter circuit 1230 in VREF circuit 120 output high-level signal SET to inverter 1234, OR gate 1236, and register 1244. After delay time delay 2 of delay circuit Delay 2 has elapsed, delay circuit Delay 2, inverter 1232, and AND gate 1233 again output low-level signal SET to inverter 1234, OR gate 1236, and register 1244. Therefore, signal SET has a pulse duration corresponding to delay time delay 2.

When signal DET1 goes low level and signal SET goes high level, AND gate 1235 supplies a low-level signal to switch SW7, which blocks the supply of clock signal CKIN to flip-flop 1239. Thereafter, even when signal SET changes from the high level back to the low level, AND gate 1235 keeps supplying the low-level signal to switch SW7 as long as signal DET1 is low level.

When signal SET goes high level, OR gate 1236 supplies resetting signal RSTC to flip-flops 1239 through 1243, thereby initializing flip-flops 1239 through 1243. Resetting signal RSTC is a pulse signal having the same pulse duration as signal SET.

When flip-flops 1239 through 1243 are reset, VREF circuit 120 sets reference potential VREF to an initial potential (0.25 V).

When reference potential VREF is set to the initial potential, comparing circuit 130 in AF power supply circuit 100 causes signal DET2 to become a low level signal, shutting down PUMP circuit 140 until potential VPPSVT reaches a prescribed potential. The prescribed potential for potential VPPSVT is a potential determined by resistors r1, r2 in AF power supply circuit 100. In FIG. 12, the prescribed potential is of a VPERI level (1.5 V), for example. After potential VPPSVT has reached the prescribed potential, comparing circuit 130 controls PUMP circuit 140 in operation to keep potential VPPSVT at the prescribed potential.

When signal SET changes from the low level to the high level, registers X0 through X4 of register 1244 outputs monitor signals X0OUT through X4OUT from semiconductor device 10.

The resetting of flip-flops 1239 through 1243 is delayed by the number of logic stages of OR gate 1236 which supplies resetting signal RSTC. Therefore, signals X0 through X4 output from output terminals/Q of flip-flops 1239 through 1243 are initialized with a time delay corresponding to the number of logic stages of OR gate 1236 after signal SET has become a high level signal. Registers X0 through X4 can thus store signals X0 through X4 before being initialized, and can output monitor signals X0OUT through X4OUT which are indicative of a voltage upon breakdown of the anti-fuse element (the count of counter circuit 1230).

When signal SET changes from the high level to the low level, i.e., at the negative-going edge of signal SET, register DET1 stores signal DET1 and outputs stored signal DET1 as monitor signal DET1OUT.

After monitor signals DET1OUT, X0OUT through X4OUT have been output out of semiconductor device 10, when signal SET goes low level again, register 1244 stops outputting monitor signals X0OUT through X4OUT from semiconductor device 10.

When signal DET1 changes from the high level to the low level, delay circuit Delay 1, inverter 1237, and AND gate 1238 in counter circuit 1230 in VREF circuit 120 output a high-level switch control signal to switches SW5, SW6. After delay time delay 1 of delay circuit Delay 1 has elapsed, delay circuit Delay 1, inverter 1237, and AND gate 1238 output a low-level switch control signal again to switches SW5, SW6. Therefore, the switch control signal has a pulse duration corresponding to delay time delay 1.

When the switch control signal goes high level, switches SW5, SW6 are actuated to cause potential VPPSVT to have a value of 1.5 V (=VPERI) and to cause potential AF_B at the other end of the anti-fuse element to have a ground potential (0 V), thereby placing semiconductor device 10 in the verifying mode. In FIG. 12, since potential AF_G is lower than potential VPPR, the anti-fuse element is judged as being rendered conductive. At this time, therefore, semiconductor device 10 finishes the writing mode and the verifying mode, and, if necessary, starts the writing mode and the verifying mode for another anti-fuse element.

Figure 13:
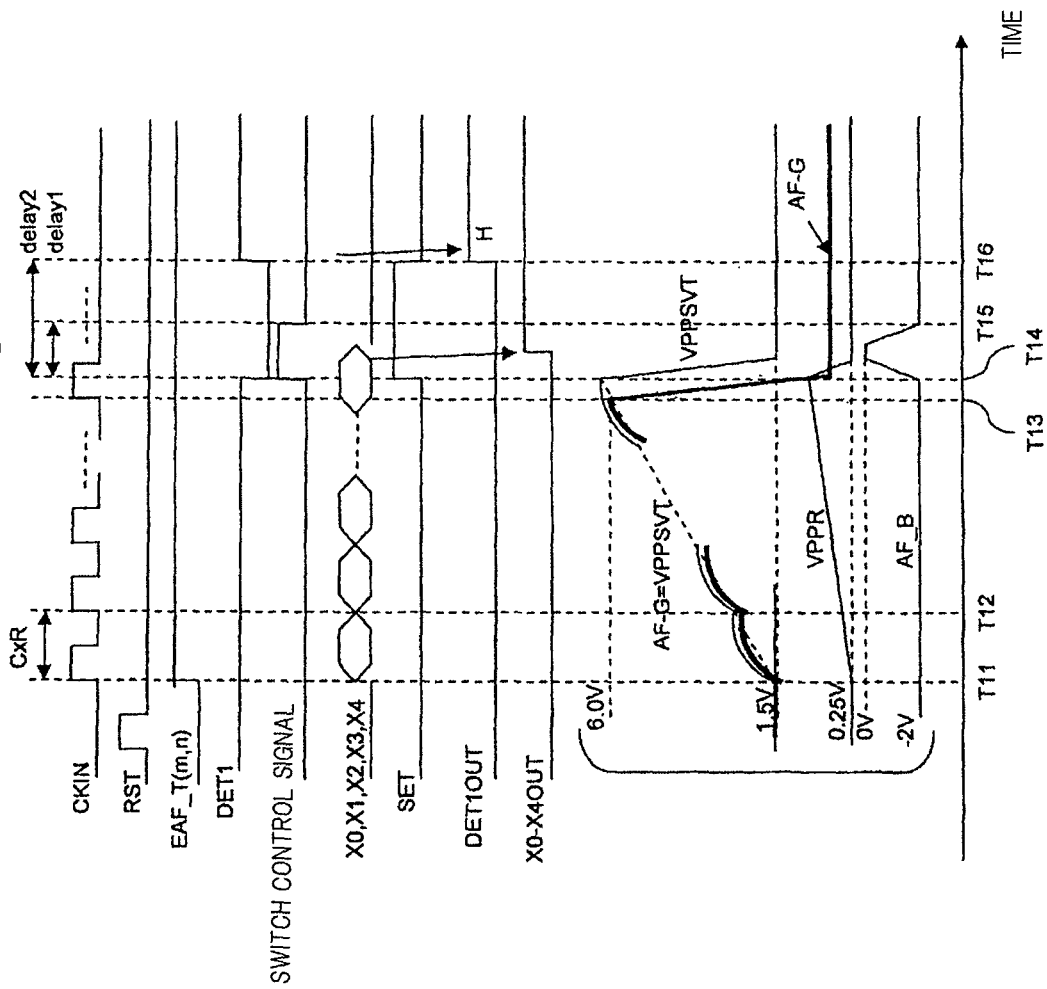
FIG. 13 is a diagram showing the waveforms of internal signals and the waveforms of monitor signals of verified results when a write failure is detected in a verifying mode after the semiconductor device shown in FIG. 2 has finished a writing mode.

FIG. 13 is a diagram showing the waveforms of internal signals and the waveforms of monitor signals of verified results when a write failure (anti-fuse element connection failure) is detected in the verifying mode after semiconductor device 10 according to the present exemplary embodiment has finished the writing mode.

In FIG. 13, the waveforms of the signals are the same as shown in FIG. 12 until time T15.

However, in the verifying mode at time T14, the anti-fuse element is judged as being rendered non-conductive because potential AF_G is higher than potential VPPR.

At time T16, when signal SET goes low level, register 1244 outputs high-level monitor signal DET1OUT, indicating that the anti-fuse element is judged as being rendered non-conductive as a result of the verifying mode.

In this case, AF power supply circuit 100 can forcibly apply an externally established voltage or select another anti-fuse set to connect anti-fuse elements again.

Since potential VPPSVT in the writing mode can be recognized from monitor signals X0OUT, X1OUT, X2OUT, X3OUT, X4OUT, the applied voltage may be set to a level higher than potential VPPSVT in the writing mode.

The reading mode of semiconductor device 10 according to the present exemplary embodiment will be described below.

FIG. 14 is a diagram showing the waveforms of internal signals when LOAD circuit 10 operates in the reading mode.

At time T21 shown in FIG. 14, signal RESETB changes from a high level to a low level. Signal RESEB is issued in response to command MRS which the user is required to input when he/she starts to use semiconductor device 10.

When signal RESETB changes from the high level to the low level, LOAD control circuit 95 changes signal ELBIAS from a low level to a high level in response to signal RESETB.

When signal ELBIAS goes high level, P-type transistor 301 is turned off.

At time T22, LOAD control circuit 95 changes signal EPREB from a high level to a low level.

When signal EPREB goes low level, P-type transistor 302 is turned on, node EOUT_B is precharged to potential VPERI, thereby causing signal EOUT_B to become a high level signal.

At time T23, LOAD control circuit 95 changes signal EDET_T from a low level to a high level.

When signal EDET_T becomes a high level signal, N-type transistor 303 is turned on.

When N-type transistor 303 is turned on, potential AF_G becomes a high level signal unless the anti-fuse element is not rendered conductive.

At time T24, LOAD control circuit 95 changes signal EPREB from the low level to the high level.

When signal EPREB becomes a high level signal, P-type transistor 302 is turned off.

In the reading mode, the other end of the anti-fuse element is connected to the ground potential. Therefore, if the anti-fuse element is rendered conductive (connected), then since the potential at node EOUT_B is low, signal EOUT_B becomes a low level signal. If the anti-fuse element is not rendered conductive, then the potential at node EOUT_B remains unchanged, and signal EOUT_B remains as a high level signal. Therefore, the data can be read based on the level change of signal EOUT_B.

After the reading mode is implemented, LOAD control circuit 95 changes signal EDET_T from the high level to the low level at time T25, and changes signal ELBIAS from the high level to the low level at time T26.

According to the exemplary embodiment, as described above, when potential AF_G at the end of the anti-fuse element is equal to or higher than potential VPPR, then AF power supply circuit 100 boosts potential VPPSVT of the power supply line connected to the end of the anti-fuse element. When the anti-fuse element is rendered conductive, causing potential AF_G to be lower than potential VPPR, AF power supply circuit 100 stops boosting potential VPPSVT.

As described above, the potential VPPSVT of the power supply line is boosted until the anti-fuse element is rendered conductive, and stops being boosted when the anti-fuse element is rendered conductive. Therefore, the anti-fuse element is prevented from being erroneously connected because the applied voltage is excessively high, and anti-fuse elements which are unable to write data accurately because the applied voltage is not sufficient enough are prevented from occurring.

The exemplary embodiment of the present invention has been described above in specific detail. However, the present invention is not limited to the above exemplary embodiment, but various changes and modifications may be made therein without departing from the scope of the invention.

For example, although AF power supply circuit 100 controls potential VPPSVT of power supply line VPPSVT, which is high potential for writing data into anti-fuse element, in the exemplary embodiment, AF power supply circuit 100 may control potential VBBSVT of power supply line VBBSVT, which is low potential for writing data into anti fuse element. For example, although DRAMs as a type of semiconductor storage device have been described in the exemplary embodiment, the principles of the present invention are also applicable to other semiconductor devices having anti-fuse elements. In the exemplary embodiment, the addresses of faulty memory cells are stored in anti-fuse elements. However, the information that can be stored in anti-fuse elements is not limited to the addresses of faulty memory cells.

It is apparent that the present invention is not limited to the above embodiments, but may be modified and changed without departing from the scope and spirit of the invention.

What is claimed is:

1. A semiconductor device comprising:
   a first power supply line and a second power supply line;
   a breakable element having an end connected to said first power supply line and another end connected to said second power supply line; and
   a power supply circuit connected to said end of said breakable element through said first power supply line, comparing a potential at said end of said breakable element with a first potential, boosting a potential of said first power supply line from a first prescribed potential if the potential at said end of said breakable element is equal to or higher than said first potential, and stopping boosting the potential of said first power supply line if said end of said breakable element and the other end thereof are connected to each other by the boosted potential, thereby making the potential at said end of said breakable element lower than said first potential.

2. The semiconductor device according to claim 1, further comprising:
   a third power supply line;

wherein said first potential is a potential produced by dividing the difference between the potential of said first power supply line and a potential of said third power supply line.

3. The semiconductor device according to claim 1, wherein after said power supply circuit has stopped boosting the potential of said first power supply line, said power supply circuit makes the potential of said first power supply line equal to a second prescribed potential, compares the potential at said end of said breakable element with said first potential, determines that said end of said breakable element and the other end thereof are connected to each other by the boosted potential if the potential at said end of said breakable element is lower than said first potential, and boosts the potential of said first power supply line from said second prescribed potential if the potential at said end of said breakable element is equal to or higher than said first potential.

4. The semiconductor device according to claim 3, wherein said power supply circuit boosts the potential of said first power supply line to an externally established potential.

5. The semiconductor device according to claim 1, further comprising:
a plurality of breakable elements; and
a plurality of first power supply lines connected respectively to ends of said breakable elements;
wherein after said power supply circuit has stopped boosting the potential of said first power supply line, said power supply circuit makes the potential of said first power supply line equal to a second prescribed potential, compares the potential at said end of said breakable element with said first potential, determines that said end of said breakable element and the other end thereof are connected to each other by the boosted potential if the potential at said end of said breakable element is lower than said first potential, and boosts potentials of the first power supply lines, other than said first power supply line connected to the end of said breakable element, from said first prescribed potential if the potential at said end of said breakable element is equal to or higher than said first potential.

6. The semiconductor device according to claim 1, wherein said power supply circuit outputs a signal indicative of whether the potential at said end of said breakable element is lower than said first potential or not, from said semiconductor device.

7. The semiconductor device according to claim 1, wherein said power supply circuit outputs a signal indicative of the potential of said first power supply line from said semiconductor device.

8. A device comprising:
first and second lines;
a first element coupled to the first line at one end thereof and the second line at the other end thereof, the first element including a first portion which is destroyed by a writing voltage between the one end of the first element and the other end of the first element; and
a first control circuit coupled to the one end of the first element with an intervention of the first line and including first and second circuit units, the first circuit unit changing a potential of the first line in one direction of up and down during a first period of time so that the first portion of the first element may be destroyed, the second circuit unit producing a first detection signal when the first portion of the first element may be destroyed, and the first circuit unit responding to the first detection signal and terminating changing the potential of the first line.

9. The device as claimed in claim 8, wherein the first control circuit includes a third circuit unit detecting whether the first portion of the first element has been destroyed or unbroken in a second period of time following the first period of time, the third circuit unit produces a second detection signal when the first portion of the first element has been unbroken, and the second circuit unit responds to the second detection signal and renders the first circuit unit restarting changing the potential of the first line in the one direction of up and down in a third period of time following the second period of time so that the first portion of the first element may be destroyed.

10. The device as claimed in claim 9, further comprising first, second and third nodes supplied respectively with a first, a second, and a third potential, the second potential being larger in absolute value than the third potential, and a second control circuit decoupling the first node from the first line and coupling the second node to the second line in the first and the third periods of time, and the second control circuit coupling the first node to the first line and the third node to the second line in the second period of time.

11. The device as claimed in claim 8, wherein the second circuit unit of the first control circuit includes a first comparator circuit coupled to the first line at a first input node thereof, and receiving a first variable reference voltage at a second input node thereof and coupled to the first circuit unit at an output node thereof.

12. The device as claimed in claim 11, wherein the second circuit unit of the first control circuit further includes a reference voltage generating circuit generating and changing the first variable reverence voltage.

13. The device as claimed in claim 9, wherein the third circuit unit of the first control circuit includes a second comparator circuit coupled to the one end of the first element at a first input node thereof, the first line at a second input node thereof and the second circuit unit at an output node thereof.

14. The device as claimed in claim 8, wherein the first element includes an anti-fuse element which includes an insulating film serving as the first portion.

* * * * *